US010127648B2

(12) United States Patent
Nukada et al.

(10) Patent No.: US 10,127,648 B2
(45) Date of Patent: Nov. 13, 2018

(54) PATTERN INSPECTION APPARATUS AND PATTERN INSPECTION METHOD

(71) Applicant: NuFlare Technology, Inc., Yokohama-shi (JP)

(72) Inventors: Hideki Nukada, Yokohama (JP); Nobutaka Kikuiri, Koganei (JP)

(73) Assignee: NuFlare Technology, Inc., Yokohama-shi (JP)

( * ) Notice: Subject to any disclaimer, the term of this patent is extended or adjusted under 35 U.S.C. 154(b) by 16 days.

(21) Appl. No.: 15/375,645

(22) Filed: Dec. 12, 2016

(65) Prior Publication Data

US 2017/0178314 A1     Jun. 22, 2017

(30) Foreign Application Priority Data

Dec. 17, 2015     (JP) ................................ 2015-246284

(51) Int. Cl.
  $G06K\ 9/00$     (2006.01)
  $G06T\ 7/00$     (2017.01)
  $G06K\ 9/62$     (2006.01)
(52) U.S. Cl.
  CPC .......... G06T 7/0004 (2013.01); G06K 9/6202 (2013.01); *G06T 2207/30148* (2013.01)
(58) Field of Classification Search
  CPC ........ G06T 7/0004; G06T 2207/30148; G06K 9/6202
  USPC ...................................................... 382/149
  See application file for complete search history.

(56) References Cited

U.S. PATENT DOCUMENTS 8,229,207 B2 *  7/2012  Tamamushi ..... G01N 21/95607
                                              382/144

FOREIGN PATENT DOCUMENTS

JP    2014-17501      1/2014
JP    2016-148701     8/2016

OTHER PUBLICATIONS

Motonari, et al. (Computer English Translation of Japanese Patent No. 2006-266864), pp. 1-9.*

* cited by examiner

*Primary Examiner* — Daniel Mariam
(74) *Attorney, Agent, or Firm* — Oblon, McClelland, Maier & Neustadt, L.L.P.

(57) ABSTRACT

A pattern inspection apparatus includes a stage to mount thereon a substrate with patterns formed thereon and be able to move two-dimensionally, plural detectors of a two-dimensional scale, whose height positions are mutually different and arranged at positions on the stage different from the substrate position, to perform measurement, the body of the two-dimensional scale arranged fixed to a position facing the plural detectors, a sensor to acquire an optical image of the pattern on the substrate, in a state where the stage with the substrate is moving in one direction on a surface for the two-dimensional movement, a calculation circuitry to calculate an image acquiring position of the optical image by using position information measured by the two-dimensional scale, and a comparison circuitry to compare, using a reference image corresponding to the image acquiring position of the optical image, the optical image with the reference image for each pixel.

10 Claims, 9 Drawing Sheets

PATTERN INSPECTION APPARATUS AND PATTERN INSPECTION METHOD

CROSS-REFERENCE TO RELATED APPLICATION

This application is based upon and claims the benefit of priority from the prior Japanese Patent Application No. 2015-246284 filed on Dec. 17, 2015 in Japan, the entire contents of which are incorporated herein by reference.

BACKGROUND OF THE INVENTION

Field of the Invention

Embodiments of the present invention relate generally to a pattern inspection apparatus, and a pattern inspection method. More specifically, for example, embodiments of the present invention relate to a pattern inspection technique for inspecting pattern defects of an object serving as a target workpiece or "sample" used in manufacturing semiconductor devices, and to an inspection apparatus for inspecting defects of minute patterns formed on a photomask, wafer, or liquid crystal substrate used in manufacturing semiconductor elements or liquid crystal displays (LCDs).

Description of Related Art

In recent years, with the advance of high integration and large capacity of large-scale integration (LSI) circuits, the line width (critical dimension) required for circuits of semiconductor elements is becoming progressively narrower. Such semiconductor elements are manufactured by circuit formation of exposing and transferring a pattern onto a wafer by means of a reduced projection exposure apparatus known as a stepper while using an original or "master" pattern (also called a mask or a reticle, hereinafter generically referred to as a mask) with a circuit pattern formed thereon. Then, in fabricating a mask for transfer printing such a fine circuit pattern onto a wafer, a pattern writing apparatus capable of writing or "drawing" fine circuit patterns by using electron beams needs to be employed. Pattern circuits may be written directly on the wafer by the pattern writing apparatus. Also, a laser beam writing apparatus that uses laser beams in place of electron beams for writing a pattern is under development.

Since LSI manufacturing requires a tremendous amount of manufacturing cost, it is crucial to improve its yield. However, as typified by a 1-gigabit DRAM (Dynamic Random Access Memory), the scale of patterns configuring an LSI is in transition from on the order of submicrons to nanometers. One of major factors that decrease the yield of the LSI manufacturing is due to pattern defects on the mask used for exposing and transfer printing an ultrafine pattern onto a semiconductor wafer by the photolithography technology. In recent years, with miniaturization of dimensions of LSI patterns formed on a semiconductor wafer, dimension to be detected as a pattern defect has become extremely small. Therefore, a pattern inspection apparatus for inspecting defects on a transfer mask used in manufacturing LSI needs to be more highly accurate.

As an inspection method, there is known a method of comparing an optical image obtained by imaging a pattern formed on a target object or "sample" such as a lithography mask at a predetermined magnification by using a magnification optical system with design data or an optical image obtained by imaging the same pattern on the target object. For example, the methods described below are known as pattern inspection methods: the "die-to-die inspection" method that compares data of optical images of identical patterns at different positions on the same mask; and the "die-to-database inspection" method that inputs, into an inspection apparatus, writing data (design pattern data) generated by converting pattern-designed CAD data to a writing apparatus specific format to be input to the writing apparatus when a pattern is written on the mask, generates a design image (reference image) based on the input writing data, and compares the generated design image with an optical image (serving as measurement data) obtained by imaging the pattern. In such inspection methods for use in the inspection apparatus, a target object is placed on the stage so that a light flux may scan the target object as the stage moves in order to perform an inspection. Specifically, the target object is irradiated with a light flux from the light source through the illumination optical system. Light transmitted through the target object or reflected therefrom forms an image on a sensor through the optical system. The image captured by the sensor is transmitted as measurement data to the comparison circuit. After performing position adjustment of images, the comparison circuit compares measurement data with reference data in accordance with an appropriate algorithm, and determines that there exists a pattern defect if the compared data are not identical.

In the inspection apparatus, the target object on the stage is irradiated with an inspection light, and its transmitted light or reflected light is input into the optical system. As a method for detecting the position of the stage, a laser length measuring method using a laser interferometer is known, for example. Then, x and y positions of the target object and a rotation angle of the target object are calculated using a result of the laser length measuring. However, laser beams are affected by fluctuation of air. Therefore, it is necessary to average the result of the laser length measuring, with spending a predetermined time. Thus, it is difficult for the laser length measuring method to rapidly and highly accurately perform position measurement.

As a measurement method less susceptible to influence of air flow and/or temperature change, a two-dimensional scale is considered and examined. Although not concerning the inspection apparatus, there is disclosed a method for measuring the position of a wafer stage by placing a wafer in the center of the wafer stage of an exposure apparatus, attaching (fixing) a head to each of the four corners of the wafer stage, and upwardly emitting a measurement beam from the head to a scale plate arranged around the irradiation opening of an exposure light (for example, refer to Japanese Unexamined Patent Application Publication (JP-A) No. 2014-017501). However, with respect to the inspection apparatus, since the region where the target object is placed serves as an optical path, it is difficult to arrange the target object in the center of the stage whose gravity is located on the working point of the stage thrust. The stage posture tends to tilt by pitching and/or rolling of the stage at the time of driving. If the head for emitting measurement beams is placed on the stage, beam irradiation positions may be shifted by the tilt of the stage. Therefore, an error may occur at the measurement position. Although it is desired to perform position measurement with great accuracy in order to conduct a highly precise inspection, a sufficient solution has not been established yet.

BRIEF SUMMARY OF THE INVENTION

According to one aspect of the present invention, a pattern inspection apparatus includes a stage configured to mount thereon a substrate with a pattern formed thereon and to be able to perform two-dimensional movement, a plurality of detectors of a two-dimensional scale, whose height positions are different from each other, configured to perform measurement and arranged at positions on the stage different from a position of the substrate, a scale body of the two-dimensional scale arranged fixed to a position facing the plurality of detectors, a sensor configured to acquire an optical image of the pattern formed on the substrate, in a state where the stage on which the substrate is placed is moving in one direction on a surface for the two-dimensional movement, a calculation processing circuitry configured to calculate an image acquiring position of the optical image by using position information measured by the two-dimensional scale, and a comparison processing circuitry configured to compare, using a reference image corresponding to the image acquiring position of the optical image, the optical image with the reference image for each pixel.

According to another aspect of the present invention, a pattern inspection method includes acquiring, in a state where a stage on which a substrate with a pattern formed thereon is placed and which can perform two-dimensional movement is moving in one direction on a surface for the two-dimensional movement, an optical image of the pattern formed on the substrate, measuring individually, in synchronized with the acquiring of the optical image, using a first detector and a second detector of a two-dimensional scale whose height positions are different from each other and which are arranged at positions on the stage and different from a position of the substrate, a position by the first detector and a position by the second detector from a same scale body of the two-dimensional scale arranged fixed to a position facing the first detector and the second detector, calculating an image acquiring position of the optical image, whose deviation amount of the image acquiring position has been corrected, by using the position measured by the first detector and the position measured by the second detector, and comparing, using a reference image corresponding to the image acquiring position of the optical image, the optical image with the reference image for each pixel, and outputting a comparison result.

DETAILED DESCRIPTION OF THE INVENTION

First Embodiment

A first embodiment of the present invention describes an inspection apparatus and method that can highly accurately measure positions with respect to at least one direction even if the stage tilts.

Figure 1:
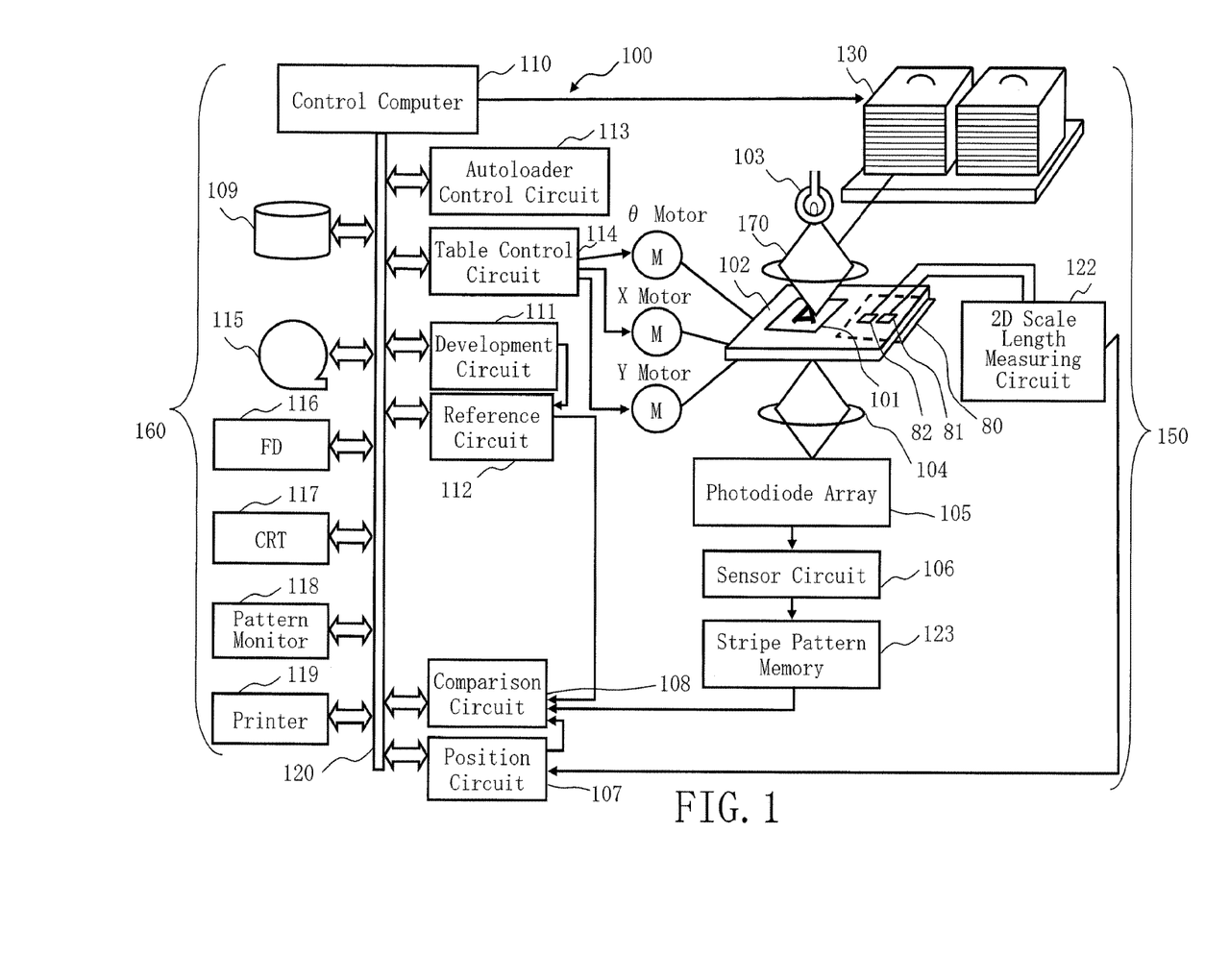
FIG. 1 illustrates a configuration of a pattern inspection apparatus according to a first embodiment.

FIG. 1 illustrates a configuration of a pattern inspection apparatus according to the first embodiment. As shown in FIG. 1, an inspection apparatus 100 that inspects defects of a pattern formed on a target object such as a mask includes an optical image acquisition mechanism 150 and a control system circuit 160 (control unit).

The optical image acquisition mechanism 150 includes a light source 103, an illumination optical system 170, an XYθ table 102 arranged movably, a magnifying optical system 104, a photodiode array 105 (an example of a sensor), a sensor circuit 106, a stripe pattern memory 123, a scale body 80 of a two-dimensional (2D) scale, a plurality of detectors 81 and 82 of the 2D scale, and a 2D scale length measuring circuit 122. A target object 101 and a plurality of detectors 81 and 82 of the 2D scale are placed on the XYθ table 102. Each of the detectors 81 and 82 has an encoder function to read a position from the scale body 80. An encoder heads can be cited as an example of the detectors 81 and 82. The target object 101 (substrate) is, for example, an exposure photomask (mask substrate) used for transfer printing a pattern onto a wafer, and a wafer (semiconductor substrate) on which patterns are formed. A pattern composed of a plurality of figure patterns to be inspected is formed on the target object 101. The target object 101 is arranged, for example, with its pattern forming surface facing downward, on the XYθ table 102. A grid-like scale to measure positions is formed on the scale body 80. Although the two detectors 81 and 82 are arranged in the example of FIG. 1, it is also preferable that three or more detectors are arranged.

In the control system circuit 160, a control computer 110 is connected, through a bus 120, to a position circuit 107, a comparison circuit 108, a development circuit 111, a reference circuit 112, an autoloader control circuit 113, a table control circuit 114, a magnetic disk drive 109, a magnetic tape drive 115, a flexible disk drive (FD) 116, a CRT 117, a pattern monitor 118, and a printer 119. The sensor circuit 106 is connected to the stripe pattern memory 123 which is connected to the comparison circuit 108. The XYθ table 102 is driven by motors of X-, Y-, and θ-axis.

In the inspection apparatus 100, an inspection optical system of large magnification is composed of the light source 103, the XYθ table 102, the illumination optical system 170, the magnifying optical system 104, the photodiode array 105, and the sensor circuit 106. The XYθ table 102 is driven by the table control circuit 114 under the control of the control computer 110. The XYθ table 102 can be moved by a drive system such as a three-axis (X, Y, and θ) motor, which drives the table in the directions of x, y, and θ. For example, a linear motor can be used as each of these X, Y, and θ motors. The XYθ table 102 is movable in the horizontal direction and the rotation direction by the motors of the X-, Y-, and θ-axis. The movement position of the target object 101 placed on the XYθ table 102 is measured by the scale body 80 and a plurality of encoders 81 and 82 that configure the 2D scale measuring system, calculated as position data of the target object 101 by the 2D scale length measuring circuit 122, and supplied to the position circuit 107.

Design pattern data (writing data) used as the basis of forming patterns on the target object 101 to be inspected is input from the outside of the inspection apparatus 100, and stored in the magnetic disk drive 109.

FIG. 1 shows configuration elements necessary for describing the first embodiment. It should be understood that other configuration elements generally necessary for the inspection apparatus 100 may also be included therein.

A pattern formed on the target object 101 is irradiated with a laser beam (for example, DUV light), which is used as an inspection light and whose wavelength is shorter than or equal to that of the ultraviolet region, from the appropriate light source 103 through the illumination optical system 170. Light having passed through the target object 101 enters the photodiode array 105 (an example of a sensor) via the magnifying optical system 104 to form an optical image thereon.

Figure 2:
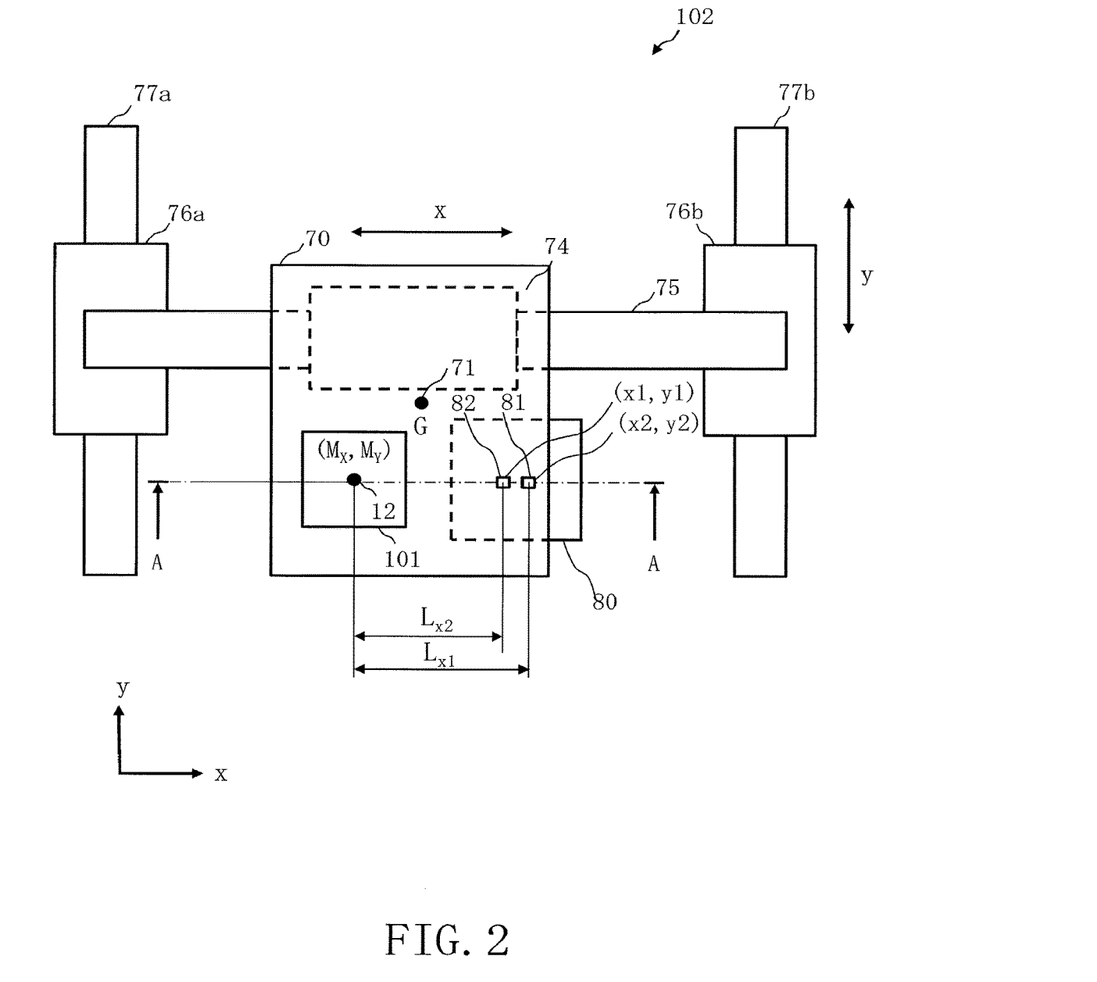
FIG. 2 is a top view showing a structure of an XYθ table, and an arrangement configuration between a 2D scale and a target object according to the first embodiment.

FIG. 2 is a top view showing the structure of the XYθ table, and the arrangement configuration between the 2D scale and the target object according to the first embodiment. As shown in FIG. 2, the XYθ table 102 includes a Zθ stage 70 (first stage), an x stage 74 (second stage), an x-axis guide rail 75, y stages 76a and 76b, and y-axis guide rails 77a and 77b. The linear stage in the x direction is configured using the x stage 74 and the x-axis guide rail 75. The linear stages in the y direction are configured using the y stages 76a and 76b and the y-axis guide rails 77a and 77b. Position adjustment of the Zθ stage 70 can also be controlled in the z direction (height direction or optical axis direction) in addition to travelling in the θ direction. For example, a plurality of piezoelectric elements (not shown) may be arranged to control the z direction position of the Zθ stage 70.

In the example of FIG. 2, the y stage 76a is placed on the y-axis guide rail 77a, to be movable (travelled) in the y direction, and the y stage 76b is placed on the y-axis guide rail 77b, to be movable (travelled) in the y direction. The y-axis guide rails 77a and 77b are arranged in parallel. Therefore, the y stages 76a and 76b travel in parallel. The x-axis guide rail 75 is arranged on the two y stages 76a and 76b in such a way as to straddle them. The x-axis guide rail 75 is arranged in the x direction to be orthogonal to the y-axis guide rails 77a and 77b. The x stage 74 is placed on the x-axis guide rail 75, to be movable (travelled) in the x direction. The Zθ stage 70 is placed on the x stage 74.

The Zθ stage 70 according to the first embodiment is cantilever supported by the x stage 74, at a position displaced from a gravity center 71(G) of the Zθ stage 70. However, it is not limited thereto, and the Zθ stage 70 may be cantilever supported by the x stage 74, at the gravity center 71(G) of the Zθ stage 70. However, the inspection target object 101 on which patterns are formed is placed at a position displaced from the x stage 74 serving as a driving action point. For example, in the case of FIG. 2, the inspection target object 101 is arranged in a region which is in the −y direction from the x stage 74 serving as a driving action point.

The detector 81 (first detector) and the detector 82 (second detector) which detect a position from the 2D scale body 80 are arranged at positions on the Zθ stage 70 and different from the position of the target object 101. In the case of FIG. 2, the center of the target object 101 is located on an optical axis 12 of the inspection light irradiating the target object 101. In particular, according to the first embodiment, the detectors 81 and 82 are arranged along one axis (x axis in the case of FIG. 2) (one direction) of the two orthogonal axes (x axis and y axis) passing through the center of the target object 101. In other words, the measurement position of the detector 81, the measurement position of the detector 82, and the center of the target object 101 are arranged in one direction (x direction, in this case). In the example of FIG. 2, the target object 101 and a plurality of detectors 81 and 82 are arranged at the positions displaced from the position of the gravity center 71(G) of the Zθ stage 70. In the example of FIG. 2, in the two regions obtained by virtually dividing the Zθ stage 70 by the line in the x direction passing through the gravity center 71(G) of the Zθ stage 70, the Zθ stage 70 is cantilever supported at one region (first region) side, and the target object 101 and a plurality of detectors 81 and 82 are arranged at the other region (second region) side.

The scale body 80 is arranged on one axis (x axis in the case of FIG. 2) of the two orthogonal axes (x axis and y axis) passing through the optical axis 12. In other words, the scale body 80 is arranged such that both the optical axis 12 of the inspection light irradiating the target object 101, and the center of the scale body 80 are located in one direction (x direction). Since the range irradiated by the inspection light at the time of inspection is on the surface of the target object 101, it is possible to reduce the x and y sizes of the scale body 80 to the size almost as large as the x and y sizes of the target object 101 (more specifically, the inspection region size of the target object 101) by arranging the optical axis 12 of the inspection light and the center of the scale body 80 on the same x axis.

Moreover, according to the first embodiment, since not the scale body 80 but the detectors 81 and 82 are arranged on the Zθ stage 70, the size of the Zθ stage 70 can be reduced compared with the case where the scale body 80 is arranged on the Zθ stage 70. When seen from the direction of the optical axis (z axial direction), the scale body 80 may be larger (longer) than the Zθ stage 70. In other words, the Zθ stage 70 is formed such that the size from the center of the target object 101 placed on the Zθ stage 70 to the end of the Zθ stage 70 in the x direction toward the side of the detectors 81 and 82 is smaller than the distance from the optical axis of an inspection light irradiating the target object 101 to the end of the scale body 80 which is farther in the x direction than the other end of the scale body 80 from the optical axis. Thus, according to the first embodiment, especially the x direction size can be reduced. Therefore, by the reduction amount of the size in the x direction, it is possible to reduce the stage tilt in the vertical direction due to rotation (pitching) whose axis is in the orthogonal direction (y direction) to the direction of the driving movement (x direction). Similarly, rotation due to yawing, rolling, etc. can also be reduced.

Figure 3:
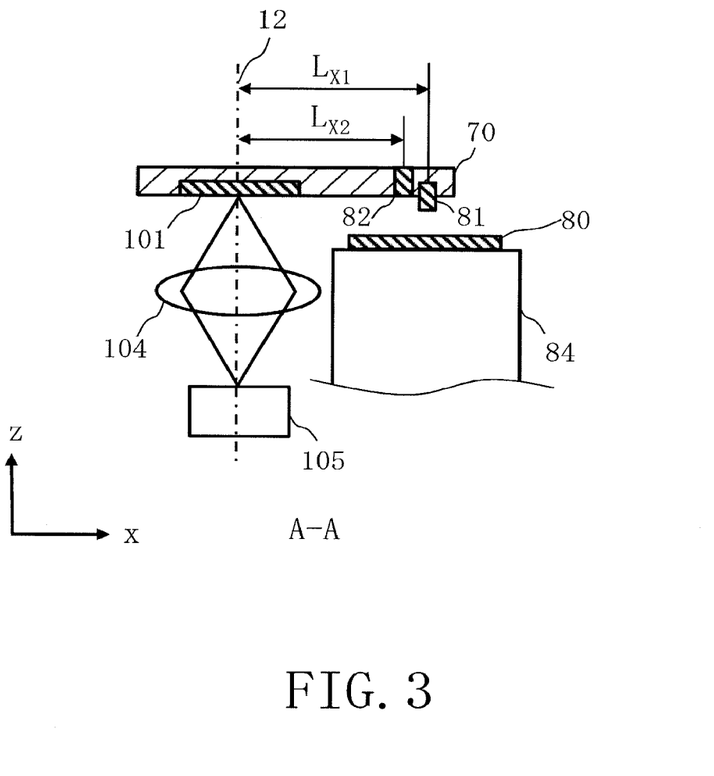
FIG. 3 is a sectional view, cut along the A-A line in FIG. 2, showing an arrangement configuration of a Zθ table, the 2D scale, and the target object according to the first embodiment.

FIG. 3 is a sectional view, cut along the A-A line in FIG. 2, showing an arrangement configuration of the Zθ table, the 2D scale, and the target object according to the first embodiment. As described above, the inspection light having passed through the target object 101 is input into the magnifying optical system 104. Therefore, as shown in FIG. 3, the magnifying optical system 104 is arranged under the region where the target object 101 is placed in the region of the Zθ stage 70. In other words, in the region of the Zθ stage 70, the region where the target object 101 is placed is located on the optical axis 12. As described above, the target object 101 is arranged on the Zθ stage 70 such that the pattern forming surface of the target object 101 is facing downward. An opening penetrating the region where the target object 101 is placed should be formed in the Zθ stage 70, and at least a part of the outer periphery of the target object should be placed on the Zθ stage 70. As shown in FIG. 3, one (in this case, the detector 82) of the detectors 81 and 82 is arranged on (or "in") the Zθ stage 70 such that the surface for emission of a measurement beam and reception of a reflected light (that is, in this case, lower surface of the detector 82: measurement surface of the detector 82) of the one is located on the same surface as the pattern forming surface (lower surface in FIG. 3) of the target object 101. As shown in FIG. 3, the other one (in this case, the detector 81) of the detectors 81 and 82 is arranged on (or "in") the Zθ stage 70 such that the surface for emission of a measurement beam and reception of a reflected light (that is, in this case, lower surface of the detector 81: measurement surface of the detector 81) of the other one is located at a height position different from that of the pattern forming surface (lower surface in FIG. 3) of the target object 101. In other words, the detectors 81 and 82 are arranged such that their height positions are different from each other. In the example of FIG. 3, the detector 82 is arranged at the position higher than the detector 81. Whichever of the detectors 81 and 82 may be arranged at a higher position.

As shown in FIG. 3, the 2D scale body 80 is arranged at the position facing the detectors 81 and 82 (in this case, below the detectors 81 and 82). The scale body 80 is fixed to a support table 84. The detector 81 is arranged such that an intersection (x1, y1) between the z-axis passing through the measurement position coordinates of the detector 81, and the surface (lower surface) for emission of a measurement beam and reception of a reflected light of the detector 81 is distant from the center of the target object 101 by $L_{x1}$ in the x direction and not shifted in the y direction. Thereby, the detector 81 can detect a value of the 2D scale body 80, at the position distant from the center of the target object 101 by $L_{x1}$ in the x direction and not shifted in the y direction. For example, the detector 81 measures a position by irradiating the grid scale of the 2D scale body 80 with a laser beam by a light emitting device, receiving a diffracted light reflected from the 2D scale body 80 by a light receiving device, and reading an interval between ruled lines on the surface of the 2D scale body 80.

Similarly, the detector 82 is arranged such that an intersection (x2, y2) between the z-axis passing through the measurement position coordinates of the detector 82, and the surface (lower surface) for emission of a measurement beam and reception of a reflected light of the detector 82 is distant from the center of the target object 101 by $L_{x2}$ in the x direction and not shifted in the y direction. Thereby, the detector 82 can detect a value of the 2D scale body 80, at the position distant from the center of the target object 101 by $L_{x2}$ in the x direction and not shifted in the y direction. For example, the detector 82 measures a position by irradiating the grid scale of the 2D scale body 80 with a laser beam by a light emitting device, receiving a diffracted light reflected from the 2D scale body 80 by a light receiving device, and reading an interval between ruled lines on the surface of the 2D scale body 80.

Thus, as described above, the detectors 81 and 82 measure positions from the same 2D scale body 80.

Figure 4:
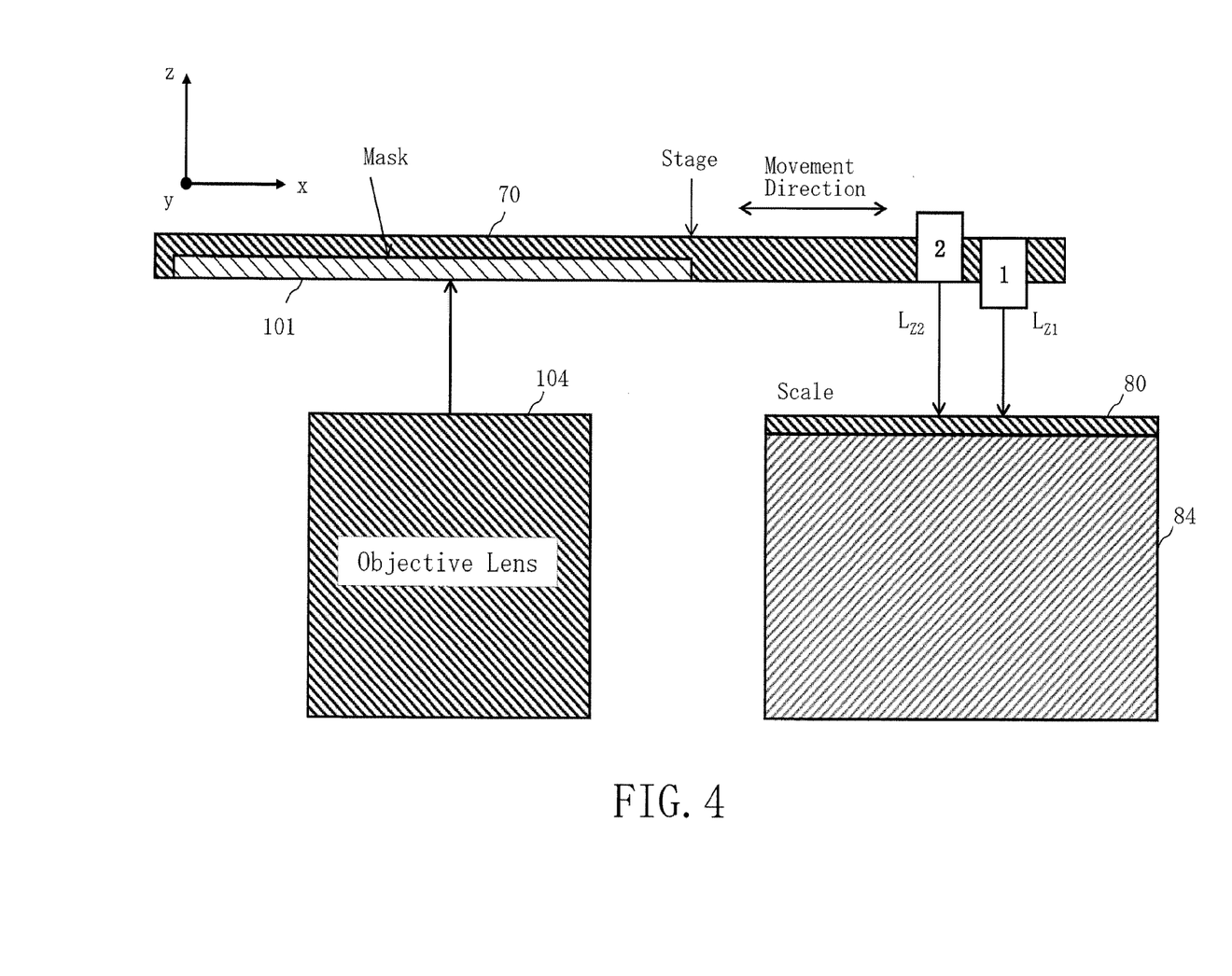
FIG. 4 shows an example of a measurement position in the state where the stage is not tilted according to the first embodiment.

FIG. 4 shows an example of the measurement position in the state where the stage is not tilted according to the first embodiment. As shown in FIG. 4, in the case where no tilt of the Zθ stage 70 (XYθ table 102) has occurred due to pitching, the measurement positions by the detectors 81 and 82 do not shift. When the detectors 81 and 82 are installed horizontally, they measure vertical positions. Therefore, the x-direction position Xm of the target object 101 is defined by the following equation (1) using the x-direction position x1 detected by the detector 81. Similarly, the x-direction position Xm of the target object 101 is defined by the following equation (2) using the x-direction position x2 detected by the detector 82.

$$Xm = x1 - L_{x1} \tag{1}$$

$$Xm = x2 - L_{x2} \tag{2}$$

The y-direction position Ym of the target object 101 is the same as the y-direction position y1 detected by the detector 81. Similarly, the y-direction position Ym of the target object 101 is the same as the y-direction position y2 detected by the detector 82. Here, since it is based on the assumption that the inspection direction is the x direction, the y-direction position movement amount ΔYm of the Zθ stage 70 (XYθ table 102) is zero.

Figure 5:
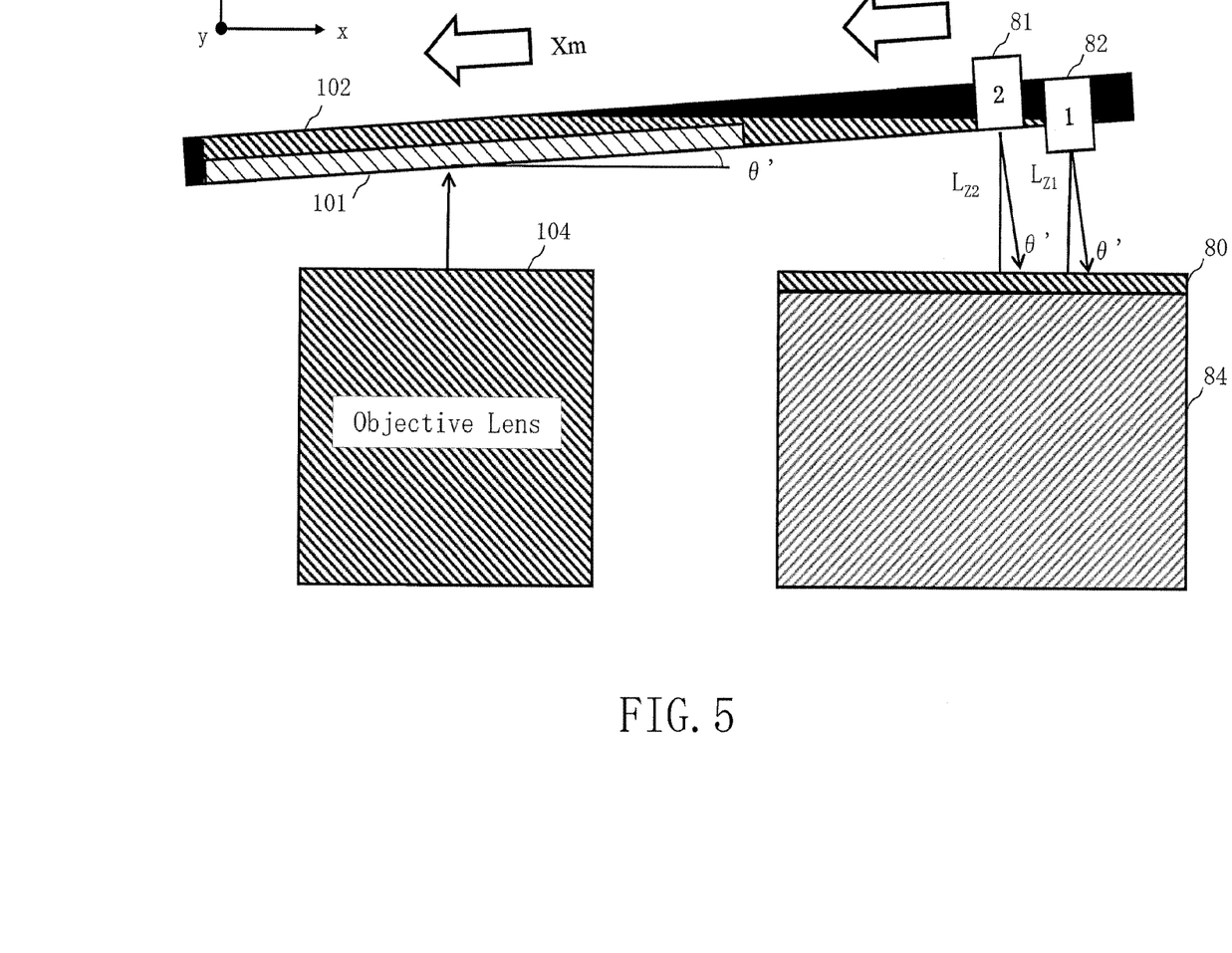
FIG. 5 shows an example of a measurement position in the state where the stage is tilted according to the first embodiment.

FIG. 5 shows an example of the measurement position in the state where the stage is tilted according to the first embodiment. As shown in FIG. 5, in the case where tilt θ' of the Zθ stage 70 (XYθ table 102) has occurred due to pitching, since the detectors 81 and 82 are not installed horizontally, they do not measure vertical (z axial direction) positions. In other words, what is called a deviation of the optical axis occurs in the detectors 81 and 82. As shown in FIG. 5, the detectors 81 and 82 measure positions x1 and x2 which are located deviated from the vertical direction (z axial direction) by the angle θ' in accordance with the tilt θ'. Therefore, errors occur at the measured positions. Then, the x-direction position Xm of the target object 101 whose tilt error has been corrected is defined by the following equations (3) and (4) using a distance $L_{Z1}$ between the lower surface of the detector 81 and the 2D scale body 80, and a distance $L_{Z2}$ between the lower surface of the detector 82 and the 2D scale body 80. In the sectional view shown in FIG. 5, the tilt θ' is based on the case where the counterclockwise rotation (left-handed rotation) is defined to be positive.

$$Xm = x1 - L_{X1} - L_{Z1} \cdot \theta' \tag{3}$$

$$Xm = x2 - L_{X2} - L_{Z2} \cdot \theta' \tag{4}$$

Therefore, when the value of the tilt θ' is unknown, it is difficult to obtain the x-direction position Xm by using only the x-direction position x1 detected by the detector 81, or the x-direction position x2 detected by the detector 82. Moreover, if the detectors 81 and 82 are arranged at the same height position, since the distance $L_{Z1}$ between the lower surface of the detector 81 and the 2D scale body 80, and the distance $L_{Z2}$ between the lower surface of the detector 82 and the 2D scale body 80 are the same values, it is also difficult to obtain the x-direction position Xm. Then, according to the first embodiment, the detectors 81 and 82 are intentionally arranged at different height positions. Thereby, the tilt θ' can be defined by the following equation (5), based on the equations (3) and (4).

$$\theta' = (x2 - x1)/(L_{Z2} - L_{Z1}) \tag{5}$$

Therefore, the x-direction position Xm of the target object 101 whose tilt error has been corrected can be defined by the following equation (6).

$$Xm = x1 - L_{X1} - L_{Z1} \cdot (x2 - x1)/(L_{Z2} - L_{Z1}) \tag{6}$$

Pattern inspection of the target object 101 is carried out using the relations described above.

Figure 6:
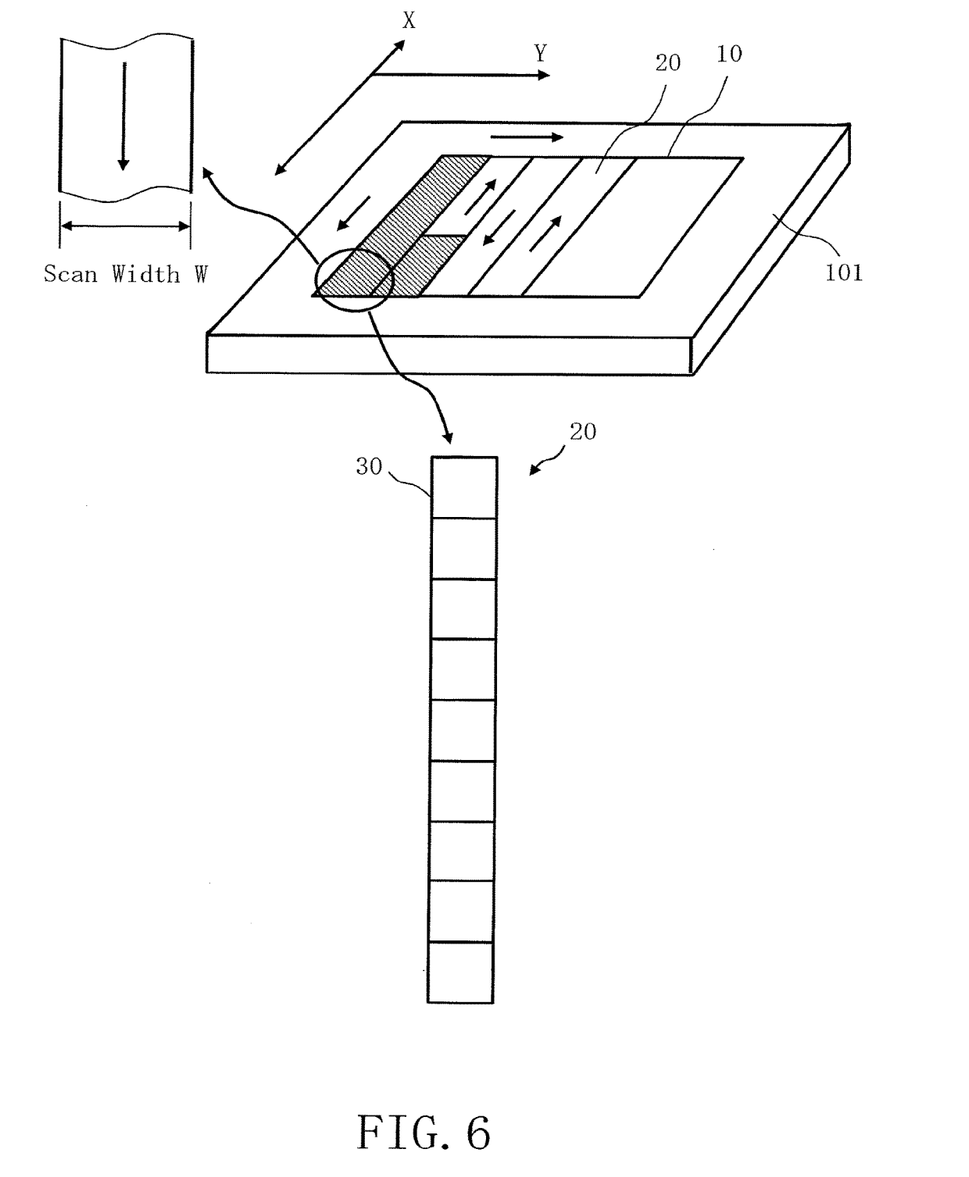
FIG. 6 is a conceptual diagram illustrating an inspection region according to the first embodiment.

FIG. 6 is a conceptual diagram illustrating an inspection region according to the first embodiment. As shown in FIG. 6, an inspection region 10 (entire inspection region) of the target object 101 is virtually divided into a plurality of strip-shaped inspection stripes 20 each having a scan width W in the y direction, for example. The inspection apparatus 100 acquires an image (stripe region image) from each inspection stripe 20. That is, with respect to each of the inspection stripes 20, the inspection apparatus 100 captures an image of a figure pattern arranged in the stripe region concerned by using a laser light in the longitudinal direction (x direction) of the stripe region concerned. The photodiode array 105 which continuously moves relatively in the x direction acquires optical images because the Zθ stage 70 moves in the x direction by the movement of the x stage 74 in the XYθ table 120. The photodiode array 105 continuously captures optical images each having a scan width W as shown in FIG. 6. In other words, while moving relatively to the Zθ stage 70 (including the x stage 74), the photodiode array 105 being an example of a sensor captures optical images of patterns formed on the target object 101 by using an inspection light. According to the first embodiment, after capturing an optical image in one inspection stripe 20, the photodiode array 105 moves in the y direction to the position of the next inspection stripe 20 and similarly captures another optical image having a scan width W continuously while moving in the direction reverse to the last image capturing direction. Thereby, the image capturing is repeated in the forward (FWD) and backward (BWD) directions, namely changing the direction reversely when advancing and returning.

The direction of the image capturing is not limited to repeating the forward (FWD) and backward (BWD) movement. Images may be captured in a fixed one direction. For example, it is sufficient to repeat FWD and FWD, or alternatively, to repeat BWD and BWD.

Figure 7:
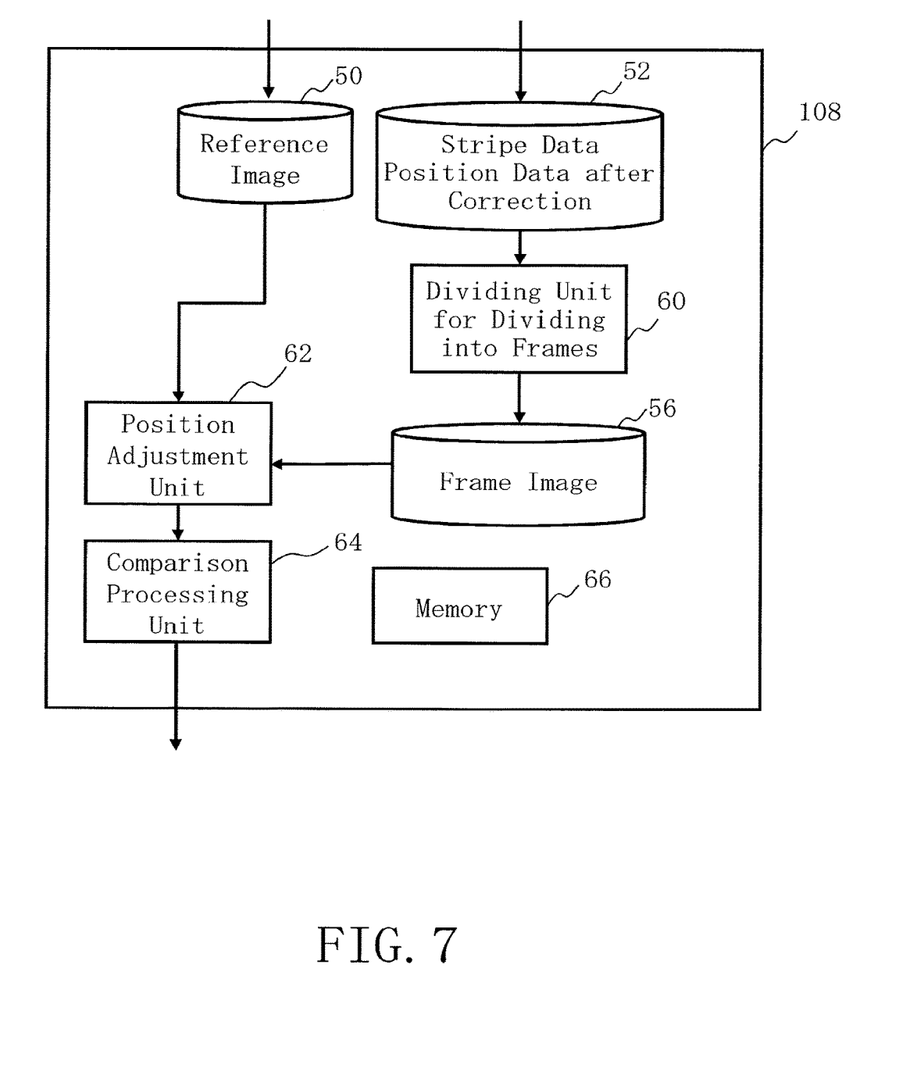
FIG. 7 is a block diagram showing an example of the internal structure of a comparison circuit according to the first embodiment.

FIG. 7 is a block diagram showing an example of the internal structure of a comparison circuit according to the first embodiment. As shown in FIG. 7, in the comparison circuit 108, there are arranged storage devices 50, 52, and 56, such as magnetic disk drives, a dividing unit 60 for dividing into frames, a position adjustment unit 62, a comparison processing unit 64, and a memory 66. Each " . . . unit", such as the dividing unit 60 for dividing into frames, the position adjustment unit 62, and the comparison processing unit 64, includes a processing circuitry. As the processing circuitry, for example, an electric circuit, computer, processor, circuit board, quantum circuit, or semiconductor device may be used. Each " . . . unit" may use a common processing circuitry (same processing circuitry), or different processing circuitries (separate processing circuitries). Data input/output to/from the dividing unit 60 for dividing into frames, the position adjustment unit 62, and the comparison processing unit 64, and data being operated are stored in the memory 66 each time.

Figure 8:
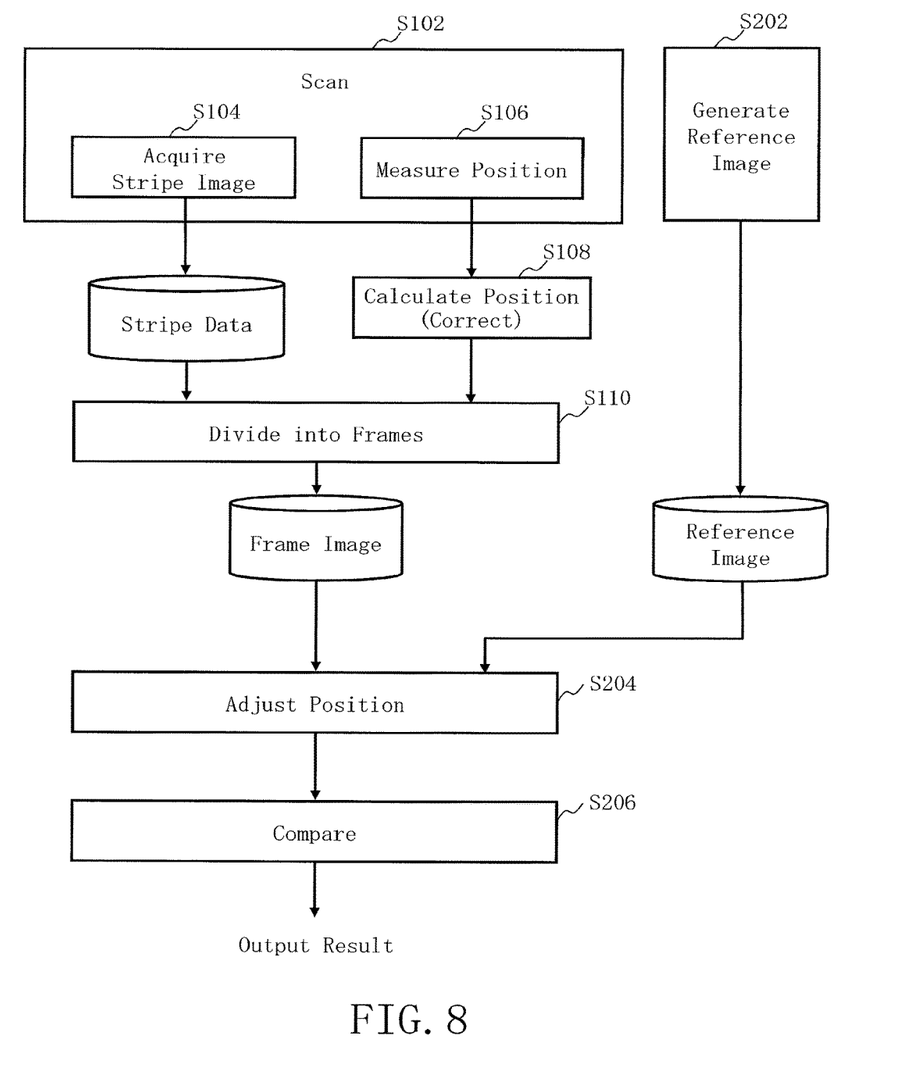
FIG. 8 is a flowchart showing main steps of an inspection method according to the first embodiment.

FIG. 8 is a flowchart showing main steps of an inspection method according to the first embodiment. As shown in FIG. 8, the inspection method according to the first embodiment executes a series of steps: a scanning step (S102), a position calculation step (S108), a dividing step (S110) for dividing into frames, a reference image generation step (S202), a position adjustment step (S204), and a comparison step (S206). Moreover, the scanning step (S102) executes, as internal steps, a stripe image acquisition step (S104) and a position measurement step (S106).

In the scanning step (S102), the optical image acquisition mechanism 150 scans the inspection stripe 20 of the photomask used as the target object 101.

Then, in the stripe image acquisition step (S104), the photodiode array 105 acquires an optical image of the pattern formed on the target object 101, in the state where the XYθ table 102 (Zθ stage 70) on which the target object 101 with formed patterns is placed and which can move two-dimensionally is moving in the x direction (one direction) on a two-dimensional plane. Specifically, it operates as described below.

First, the x stage 74 and the y stage 76 are driven in order to move the Zθ stage 70 to the position at which a target inspection stripe 20 can be captured. A pattern formed on the target object 101 is irradiated with a laser beam (for example, DUV light) from the appropriate light source 103, which is used as an inspection light and whose wavelength is shorter than or equal to that of the ultraviolet region, through the illumination optical system 170. In other words, the illumination optical system 170 illuminates the target object 101 to be inspected with an inspection light. A light having passed through the target object 101 is focused, through the magnifying optical system 104, to form an image on the photodiode array 105 (an example of a sensor) as an optical image to be input thereinto. It is preferable to use, for example, a TDI (time delay integration) sensor, etc. as the photodiode array 105. In the state in which the Zθ stage 70 (first stage) with the inspection target object 101 thereon is moving, the photodiode array 105 (sensor) captures an optical image of a pattern formed on the inspection target object 101.

A pattern image focused/formed on the photodiode array 105 is photoelectrically converted by each light receiving element of the photodiode array 105, and further, analog-to-digital (A/D) converted by the sensor circuit 106. Then, pixel data for the inspection stripe 20 to be measured is stored in the stripe pattern memory 123. When imaging such pixel data (stripe region image), a dynamic range whose maximum gray level is defined as the case of, for example, 60% of the quantity of illumination light being incident is used as the dynamic range of the photodiode array 105.

In the position measurement step (S106) of the scanning step, in synchronized with acquisition of an optical image, the detectors 81 and 82 of the two-dimensional scale, whose height positions are different from each other, are arranged at positions on the XYθ table 102 (Zθ stage 70) different from the position of the target object 101, individually measure a position from the same scale body 80 of the two-dimensional scale arranged fixed to a position facing the detectors 81 and 82. The 2D scale length measuring circuit 122 inputs position information indicated by the 2D scale body 80 detected by the detectors 81 and 82, and measures the position (coordinates (x1, y1)) detected by the detector 81 and the position (coordinates (x2, y2)) detected by the detector 82. The position data is output to the position circuit 107.

In the position calculation step (S108), the position circuit 107 (calculation unit) calculates an image acquiring position (Xm, Ym) of an optical image of the inspection stripe 20 to be measured, by using the position information measured by the two-dimensional scale. Specifically, the position circuit 107 calculates the image acquiring position (Xm, Ym) of the optical image whose deviation amount of the image acquiring position has been corrected, by using a position (coordinates (x1, y1)) measured by the detector 81 and a position (coordinates (x2, y2)) measured by the detector 82. The image acquiring position Xm in the x direction is calculated using the equation (6). By this, the deviation amount of the image acquiring position of the optical image due to tilting of the Zθ stage 70 by pitching can be corrected. The image acquiring position Ym in the y direction is calculated as Ym=y1.

Then, the stripe region image is sent, with data indicating the corrected image acquiring position (Xm, Ym) of the photomask 101 on the XYθ table 102 (Zθ stage 70) output from the position circuit 107, to the comparison circuit 108. Measurement data (pixel data) is 8-bit unsigned data, for example, and indicates a gray level (light intensity) of brightness of each pixel. The stripe region image input into the comparison circuit 108 is stored in the storage device 52.

In the dividing step (S110) for dividing into frames, the dividing unit 60 divides, in the x direction, a stripe region image by a predetermined size (for example, by the same width as the scan width W) so that a frame image of the target frame region 30 may be clipped from the stripe region image (optical image) of the inspection stripe 20. For example, it is divided into frame images each having 512× 512 pixels. When clipping an image of the target frame region 30 from a stripe region image, since the position data has already been corrected, the frame image can be clipped in the state where positional deviation due to tilting of the XYθ table 102 (Zθ stage 70) by pitching has been corrected. By this processing, a plurality of frame images (optical images) corresponding to a plurality of frame regions 30 can be acquired. A plurality of frame images are stored in the storage device 56. Thus, data of an image (measured image) being one side to be compared for inspection is generated.

In the reference image generation step (S202), first, the development circuit 111 (an example of a reference image generation unit) generates a design image by performing image development based on design pattern data serving as a basis for forming patterns on the target object 101 to be inspected. Specifically, the development circuit 111 reads design data from the magnetic disk drive 109 through the control computer 110, and generates a design image by converting (image developing) each figure pattern in the region of a target frame 30 defined in the design data having been read into image data of binary values or multiple values.

Here, basics of figures defined in the design pattern data are, for example, rectangles or triangles. For example, there is stored figure data (vector data) defining the shape, size, position, and the like of each pattern figure by using information, such as coordinates (x, y) of the reference position of a figure, lengths of sides of the figure, and a figure code serving as an identifier for identifying the figure type such as a rectangle, a triangle and the like.

When information on a design pattern, used as figure data, is input to the development circuit 111, the data is developed into data of each figure. Then, the figure code, figure dimensions and the like indicating the figure shape in the figure data are interpreted. Then, the development circuit 111 develops design image data of binary values or multiple values, as a pattern to be arranged in a square in units of grids of predetermined quantization dimensions, and outputs the developed data. In other words, the development circuit 111 reads design data, calculates the occupancy rate occupied by figures in a design pattern for each grid obtained by virtually dividing an inspection region into grids in units of predetermined dimensions, and outputs n-bit occupancy rate data. For example, it is preferable that one grid is set as one pixel. If one pixel has a resolution of $1/2^8$ (=$1/256$), $1/256$ small regions are allocated to the region of figures arranged in a pixel in order to calculate the occupancy rate in the pixel. Then, a design image of 8-bit occupancy rate data is generated for each pixel. The design image data is output to the reference circuit 112.

The reference circuit 112 performs filtering processing of the design image to generate a reference image.

Figure 9:
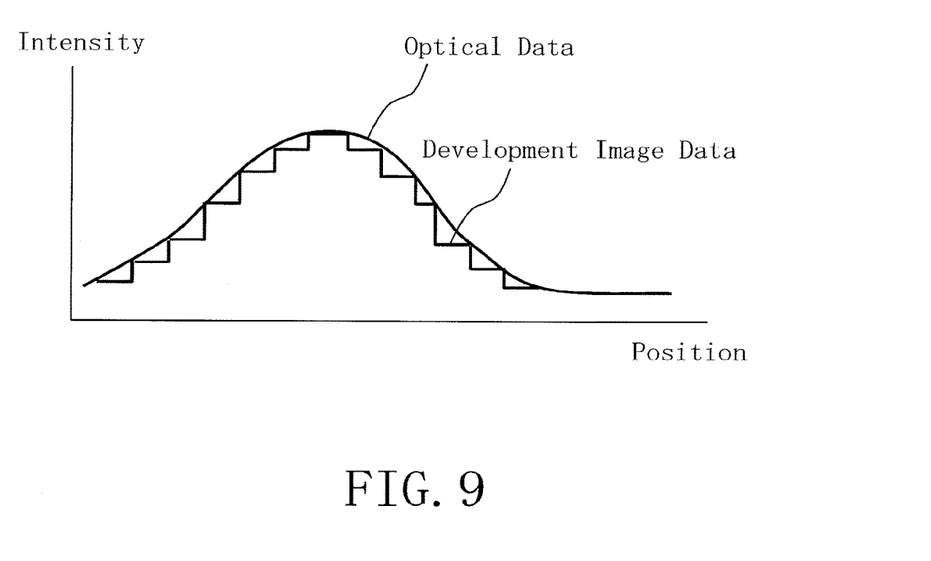
FIG. 9 illustrates filter processing according to the first embodiment.

FIG. 9 illustrates filter processing according to the first embodiment. Since the measurement data being an optical image obtained from the sensor circuit 106 is in the state affected by the filtering due to resolution characteristics of the magnifying optical system 104, an aperture effect of the photodiode array 105, or the like, in other words, in the analog state continuously changing, it is possible to match reference design image data with the measurement data by also performing filter processing on the reference design image data being image data on the design side having image intensity (gray value) represented by digital values. In this manner, a reference image to be compared with a frame image (optical image) is generated. The generated reference image is input into the comparison circuit 108 to be stored in the storage device 50. Thus, data of image (reference image) being the other side to be compared for inspection is generated.

In the position adjustment step (S204), the position adjustment unit 62 reads a frame image (optical image) to be compared from the storage device 56, and a reference image to also be compared from the storage device 50. Then, position adjustment is performed based on a predetermined algorithm. For example, the position adjustment is performed using a least-squares method.

In the comparison step (S206), the comparison processing unit 64 compares a frame image and a reference image for each pixel, based on predetermined determination conditions in order to determine whether there is a defect, such as a shape defect. As the determination conditions, for example, a predetermined algorithm is used, based on which a frame image and its corresponding reference image are compared with each other for each pixel in order to determine whether a defect exists or not. Then, the comparison result is output, and specifically should be output to the magnetic disk drive 109, magnetic tape drive 115, flexible disk drive (FD) 116, CRT 117, or pattern monitor 118, or alternatively, output from the printer 119.

As described above, according to the first embodiment, even if a tilt occurs in the XYθ table 102 (Zθ stage 70), it is possible to highly accurately measure positions with respect to at least one direction (here, for example, imaging direction: x direction). Accordingly, inspection accuracy can be improved.

In the above description, what is described as a " . . . circuit" includes a processing circuitry. As the processing circuitry, for example, an electric circuit, computer, processor, circuit board, quantum circuit, or semiconductor device may be used. Each " . . . unit" may use a common processing circuitry (same processing circuitry), or different processing circuitries (separate processing circuitries). When programs are used, they are stored in a recording medium, such as a magnetic disk drive, magnetic tape drive, FD, ROM (Read Only Memory), etc. For example, each circuit, etc. in the position circuit 107, comparison circuit 108, development circuit 111, reference circuit 112, autoloader control circuit 113, and table control circuit 114 includes a processing circuit. As this processing circuit, for example, an electrical circuit, a computer, a processor, a circuit board, a quantum circuit, or a semiconductor device may be used.

Embodiments have been explained referring to specific examples described above. However, the present invention is not limited to these specific examples. For example, in Embodiments, although a transmitted illumination optical system using a transmitted light is described as the illumination optical system 170, it is not limited thereto. For example, a reflected illumination optical system using a reflected light may also be used. Alternatively, a transmitted light and a reflected light may be used simultaneously by way of combining a transmitted illumination optical system and a reflection illumination optical system.

Moreover, although the example of FIG. 2 shows the case where a plurality of detectors for the 2D scale are arranged at different height positions and along the axis in imaging direction (inspection direction: x direction) of the target object 101 which, for example, passes through the center of the target object 101, it is not limited thereto. It is also preferable to further arrange a plurality of detectors for the 2D scale at different height positions and along the axis in the direction (y direction) orthogonal to the imaging direction (inspection direction: x direction) of the target object 101, which passes through the center of the target object 101, for example. Thereby, it becomes possible to highly accurately measure not only position deviation in the x direction due to tilting of the Zθ stage 70 by pitching but also position deviation in the y direction due to tilting of the Zθ stage 70 by rolling.

Moreover, the arrangement positions of the detectors 81 and 82 are not limited to be along the x-direction axis passing through the center of the target object 101. The detectors 81 and 82 may be arranged to be shifted in the y direction from the x-direction axis passing through the center of the target object 101. Alternatively, the detectors 81 and 82 may be arranged such that their y-direction positions are shifted from each other. In that case, although the accuracy of detected position becomes less accurate compared with the case of the first embodiment, a certain effect can be obtained on the position deviation.

While the apparatus configuration, control method, and the like not directly necessary for explaining the present invention are not described, some or all of them can be selectively used on a case-by-case basis when needed. For example, although description of the configuration of the control unit for controlling the inspection apparatus 100 is omitted, it should be understood that some or all of the configuration of the control unit can be selected and used appropriately when necessary.

In addition, any other pattern inspection apparatus and pattern inspection method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern inspection apparatus comprising:
    a stage configured to mount thereon a substrate with a pattern formed thereon and to be able to perform two-dimensional movement;
    a plurality of detectors of a two-dimensional scale, whose height positions are different from each other, configured to perform measurement and arranged at positions on the stage different from a position of the substrate;
    a scale body of the two-dimensional scale arranged fixed to a position facing the plurality of detectors, a position by one of the plurality of detectors and a position by another one of the plurality of detectors are measured from a same scale body;
    a sensor configured to acquire an optical image of the pattern formed on the substrate, in a state where the stage on which the substrate is placed is moving in one direction on a surface for the two-dimensional movement, the one direction being along an axis in an imaging direction of the substrate;
    a calculation processing circuitry configured to calculate an image acquiring position of the optical image by using the position measured by the one of the plurality of detectors of the two-dimensional scale and the position measured by the another one of the plurality of detectors of the two-dimensional scale; and
    a comparison processing circuitry configured to compare, using a reference image corresponding to the image acquiring position of the optical image, the optical image with the reference image for each pixel.

2. The apparatus according to claim 1, wherein the plurality of detectors include a first detector and a second detector, and the first detector and the second detector individually measure a position from the scale body.

3. The apparatus according to claim 2, wherein the first detector and the second detector are arranged in the one direction.

4. The apparatus according to claim 1, wherein the scale body is arranged such that both an optical axis of an inspection light irradiating the substrate and a center of the scale body are located in the one direction.

5. The apparatus according to claim 1, wherein the substrate and the plurality of detectors are arranged at positions displaced from a gravity center of the stage.

6. The apparatus according to claim 5, wherein the stage is cantilever supported at a position displaced from the gravity center of the stage.

7. The apparatus according to claim 6, wherein, in a first region and a second region of the stage obtained by virtually dividing the stage by a line in the one direction passing through the gravity center of the stage, the stage is cantilever supported at a side of the first region, and the substrate and the plurality of detectors are arranged at a side of the second region.

8. The apparatus according to claim 1, wherein the stage is formed such that a size from a center of the substrate placed on the stage to an end of the stage in the one direction toward a side of the first detector and the second detector is smaller than a distance from an optical axis of an inspection light irradiating the substrate to an end of the scale body which is farther in the one direction than another end of the scale body from the optical axis.

9. The apparatus according to claim 1, wherein one of the first detector and the second detector is arranged on the stage such that a measurement surface of the one is located on a same surface as a pattern forming surface of the substrate, and another of the first detector and the second detector is arranged on the stage such that a measurement surface of the another is located at a height position different from that of the pattern forming surface of the substrate.

10. A pattern inspection method comprising:
    acquiring, in a state where a stage on which a substrate with a pattern formed thereon is placed and which can perform two-dimensional movement is moving in one direction on a surface for the two-dimensional movement, the one direction being along an axis in an imaging direction of the substrate, an optical image of the pattern formed on the substrate;
    measuring individually, in synchronized with the acquiring of the optical image, using a first detector and a second detector of a two-dimensional scale whose height positions are different from each other and which are arranged at positions on the stage and different from a position of the substrate, a position by the first detector and a position by the second detector from a same scale body of the two-dimensional scale arranged fixed to a position facing the first detector and the second detector;

calculating an image acquiring position of the optical image, whose deviation amount of the image acquiring position has been corrected, by using the position measured by the first detector and the position measured by the second detector; and comparing, using a reference image corresponding to the image acquiring position of the optical image, the optical image with the reference image for each pixel, and outputting a comparison result.

\* \* \* \* \*